United States Patent
Varland et al.

(10) Patent No.: US 8,933,688 B2
(45) Date of Patent: Jan. 13, 2015

(54) FAST AC VOLTAGE DETECTOR

(75) Inventors: Eric O. Varland, Rockford, IL (US); Karl James Hamilton, Cherry Valley, IL (US); Philip Chandler, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 583 days.

(21) Appl. No.: 13/248,583

(22) Filed: Sep. 29, 2011

(65) Prior Publication Data

US 2013/0082685 A1   Apr. 4, 2013

(51) Int. Cl.
*G01R 19/22* (2006.01)
*G01R 19/155* (2006.01)
*G01R 19/165* (2006.01)

(52) U.S. Cl.
CPC ........ *G01R 19/155* (2013.01); *G01R 19/16547* (2013.01)
USPC .............. 324/119; 324/98; 327/531; 327/143

(58) Field of Classification Search
CPC .......................... H05B 33/089; H02J 2009/007
See application file for complete search history.

(56) References Cited

U.S. PATENT DOCUMENTS

| | | | |
|---|---|---|---|
| 4,782,422 A | 11/1988 | Jones et al. | |
| 5,047,914 A | 9/1991 | Dhyanchand et al. | |
| 5,552,978 A * | 9/1996 | Moncorge | 363/89 |
| 5,675,640 A * | 10/1997 | Tappert et al. | 379/374.01 |
| 5,949,158 A * | 9/1999 | Schulz | 307/127 |
| 5,986,242 A * | 11/1999 | Maitani et al. | 219/501 |
| 5,991,604 A * | 11/1999 | Yi | 455/74.1 |
| 6,104,622 A * | 8/2000 | Shin | 363/21.07 |
| 6,535,033 B2 | 3/2003 | Yamauchi et al. | |
| 6,538,478 B2 | 3/2003 | Andoh | |
| 6,678,173 B2 * | 1/2004 | Nakagawa | 363/44 |
| 6,774,617 B2 | 8/2004 | Andoh | |
| 7,205,756 B1 | 4/2007 | Baker | |
| 7,796,366 B2 | 9/2010 | Kilroy et al. | |
| 7,898,300 B2 | 3/2011 | Lim | |
| 7,936,131 B2 | 5/2011 | Yeh | |
| 7,994,807 B1 | 8/2011 | Koh et al. | |
| 8,148,907 B2 * | 4/2012 | Sadwick et al. | 315/246 |
| 8,462,527 B1 * | 6/2013 | Vinciarelli | 363/125 |
| 2007/0047270 A1 * | 3/2007 | Makino et al. | 363/34 |
| 2010/0265743 A1 * | 10/2010 | Joshi | 363/84 |

* cited by examiner

*Primary Examiner* — Richard Isla Rodas
(74) *Attorney, Agent, or Firm* — Carlson, Gaskey & Olds, P.C.

(57) ABSTRACT

A fast AC voltage detector includes a bridge rectifier connected to an AC power source, a threshold detector connected to an output of the bridge rectifier, a voltage isolation circuit connected to the threshold detector, a continuous voltage averager connected to an output of the voltage isolation circuit, and a Schmidt trigger connected to the continuous voltage averager. The Schmidt trigger is operable to output a first voltage level when a load is preset on said AC power source and a second voltage level when no load is present on said AC power source.

20 Claims, 3 Drawing Sheets

FAST AC VOLTAGE DETECTOR

TECHNICAL FIELD

The present disclosure relates to power control circuit testing, and more specifically to AC voltage detection for load power application and removal timing.

BACKGROUND OF THE INVENTION

Power control circuit testing involves timing when a load is applied to, or removed from, a circuit. One method used to perform this monitoring is to monitor the voltage at a load output. Typically, in order to monitor an AC output, a peak detector is used. Peak detectors rectify and filter the AC output and sense the resulting voltage levels to determine if a load is being driven by an AC power source.

An AC voltage being applied to the load is detected when the output voltage of the peak detector crosses from below an upper detection threshold to above the upper detection threshold. A capacitor in the detection circuit then holds the voltage between peaks for ½ cycle of the input AC waveform above the upper detection threshold in order to prevent false load state changed events. A load detection circuit using a capacitor in this manner is to be referred to as a capacitive hold AC voltage detector.

When a load is removed from the circuit, the capacitor slowly discharges and the removal of the load is detected when the voltage falls below a lower detector threshold. The slow discharge is due to the presence of the capacitor and relatively the large capacitance values that must be used to prevent false output changes when AC power is applied or removed from the monitored load.

SUMMARY OF THE INVENTION

A fast AC voltage detector has a bridge rectifier with inputs for connecting to an AC power source, a threshold detector connected to the output of the bridge rectifier, an isolation circuit connected to the output of the threshold detector, a continuous voltage averager connected to an output of the isolation circuit, and a Schmidt trigger amplifier connected to the continuous voltage averager and operable to output a first voltage level when AC voltage is present on the bridge rectifier inputs and a second voltage level when no AC voltage is present on the bridge rectifier inputs.

A method for detecting a load includes the steps of converting an AC waveform to a continuous average square wave representation of the AC waveform, detecting a presence of a load when the continuous average square wave crosses a load applied threshold, and detecting the removal of the load when the continuous average square wave crosses a load removed threshold.

These and other features of the present invention can be best understood from the following specification and drawings, the following of which is a brief description.

DETAILED DESCRIPTION OF AN EMBODIMENT

Figure 1:
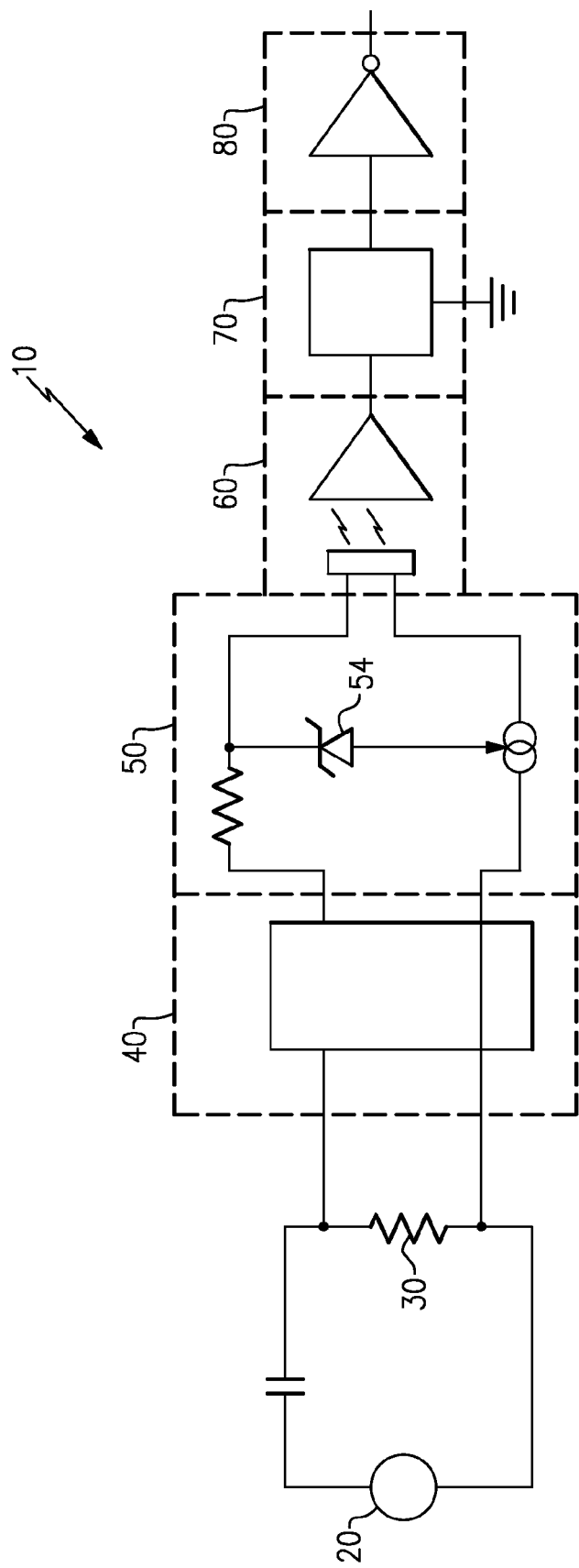
FIG. 1 illustrates an example fast AC voltage detection circuit.

FIG. 1 illustrates a fast AC voltage detector 10 for detecting the application of, or the removal of, an AC power source 20 from a load. The fast AC voltage detector 10 has a bridge rectifier 40 that rectifies the AC signal from the power source 20 into a full wave rectified AC signal. The full wave rectified AC signal is passed to a Zener driven constant current source 50 that forces the full wave rectified AC signal into a square wave representative of the full wave rectified AC signal. The square wave has a peak when the voltage of the full wave rectified AC signal exceeds the conduction threshold of a Zener diode 54, and a valley when the full wave rectified AC signal does not exceed the Zener diode 54 conduction threshold.

The square wave signal is passed through an isolation amplifier 60 and to a resistive/capacitive (RC) voltage averager 70. The RC voltage averager 70 outputs a continuing average of the square wave signal. Alternately, any other continuing voltage average can be used in place of the RC voltage average 70. The continuing average signal is passed from the RC voltage average 70 to a Schmidt trigger 80. The Schmidt trigger 80 detects an application of a load by detecting when the continuing average signal crosses from below an upper detection threshold to above the upper detection threshold. Likewise, the Schmidt trigger detects a load being removed by detecting the continuing average signal crossing from above a lower detection threshold to below the lower detection threshold. The Schmidt trigger outputs a high signal while there is no load applied and a low signal (0V) when a load is present, thereby providing a load detection signal for any attached controllers.

Figure 2:
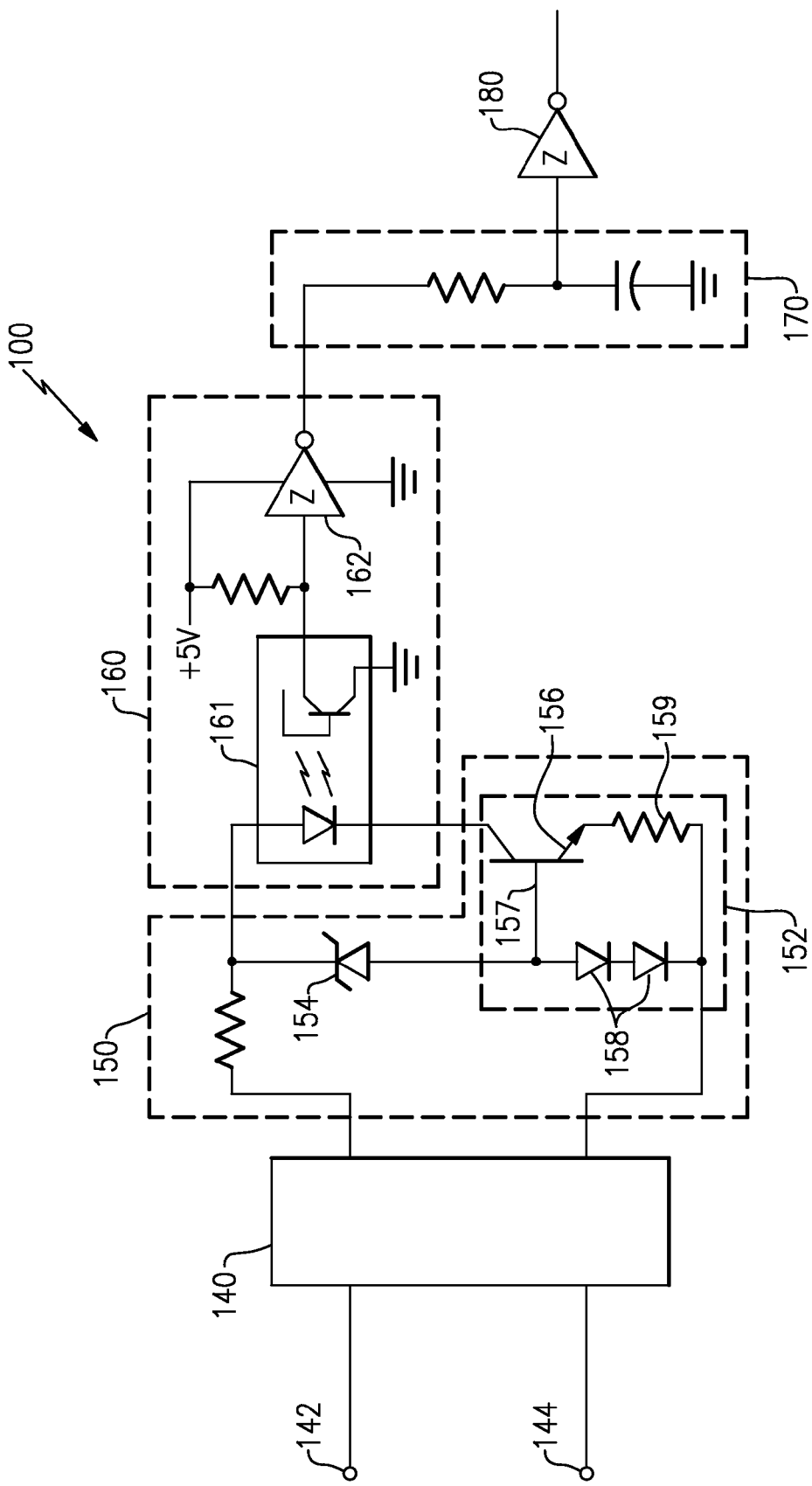
FIG. 2 illustrates the fast AC voltage detection circuit of FIG. 1 in greater detail.
Figure 3A:
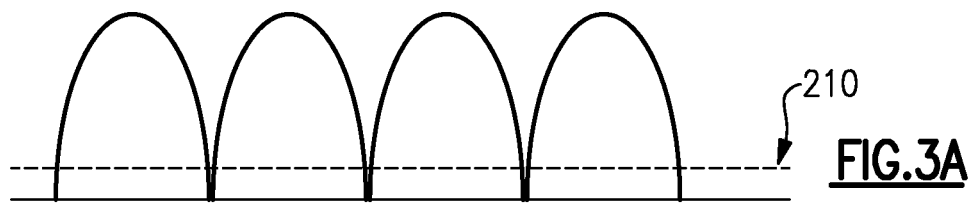
FIG. 3A illustrates an example full wave rectified AC wave output of the bridge rectifier of FIG. 2.
Figure 3B:
FIG. 3B illustrates an example square wave output of the Zener driven constant current source of FIG. 2.
Figure 3C:
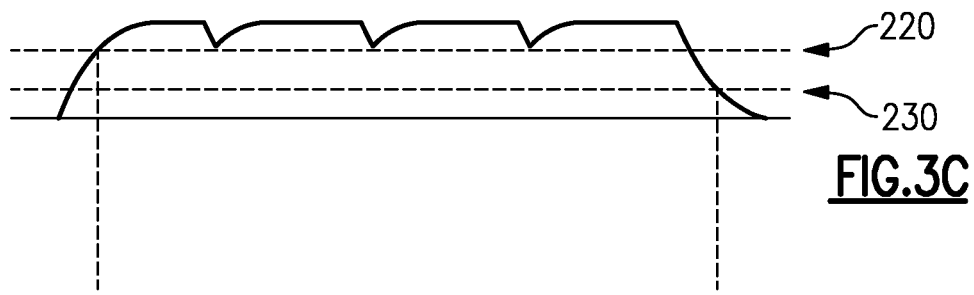
FIG. 3C illustrates an example continuing average wave output of the resistive/capacitive voltage averager of FIG. 2.
Figure 3D:
FIG. 3D illustrates an example timing output of the Schmidt trigger of FIG. 2.

FIG. 2 illustrates the example AC voltage detector 10 of FIG. 1 in greater detail. FIGS. 3A, 3B, and 3C illustrate the AC power source 20 output signal as it progresses through the AC voltage detector 100 of FIG. 2. The bridge rectifier 140 is a standard AC full wave rectifier that accepts inputs 142, 144 from a load or power source, and outputs a full wave rectified AC waveform (illustrated in FIG. 3A) to a Zener diode and Zener driven constant current source segment 150 of the AC voltage detector 100.

The Zener driven constant current source 152 is connected to the opto-isolator 160 via a transistor 156 within the Zener driven constant current source 152. The transistor 156 receives a control input from the anode of the Zener diode 154. Thus, when the rectified AC waveform exceeds a conduction value 210 (illustrated in FIG. 3A) of the Zener diode 154, the transistor 156 control input 157 receives a signal and the transistor 156 enters a closed state, thereby allowing current to pass. When the transistor 156 is in the closed state, the transistor 156, a pair of diodes 158 and a resistor 159 operate as a constant current source and output a steady current to the opto-isolator 160.

When the AC waveform does not exceed the conduction value 210 of the Zener diode 154, the control input 157 to transistor 156 and diodes 158 do not receive a control signal, and the transistor 156 stays open. The open transistor 156 removes the drive current from the isolation amplifier 160. A result of the above described interaction is that the Zener driven constant current source 152 outputs a constant current to the isolation amplifier 160 when the rectified AC waveform exceeds the conduction value 210 of the Zener diode 154 and outputs no current when the AC waveform does not exceed the conduction value 210. Thus, the Zener driven constant current source 152 converts the AC waveform of FIG. 3A to a square wave output illustrated in FIG. 3B. The exact threshold voltage of the Zener diode 154 depends on the minimum to maximum range of the input voltage to be detected. The threshold voltage is high enough to avoid false input detection from leaky power control devices such as those employing resistor-capacitor snubber circuits, but low enough that the minimum input voltage to be detected will produce a square wave with a longer on time than off time at the threshold detector's output.

The isolation amplifier 160 isolates square wave output of the Zener driven constant current source 152 from an RC voltage averager 170, thereby preventing the propagation of potentially harmful voltage and transient signals from the power sources at 142 and 144 to the timing circuits of an attached controller. The particular isolator 161 used for the isolation amplifier 160 in the illustrated example is a standard light emitting diode optically coupled to a photosensitive transistor in a single component package referred to as an optical isolator or opto-isolator. The square wave signal from the optical isolator 161 is sent to a standard Schmidt trigger 162 to preserve the rise and fall times of the waveform and provide sufficient drive capability for following circuits.

Once the square wave signal, illustrated in FIG. 3B, is isolated and buffered by the isolation amplifier 160, the signal is passed to a RC voltage averager 170 that performs a continuing averaging function on the square wave. The RC voltage averager 170 causes the valleys of the square wave function to be averaged up, resulting in a continuing average signal illustrated in FIG. 3C, and corresponding to the square wave signal of FIG. 3B and the full wave rectified signal of FIG. 3A. The time constant of the RC voltage averager 170 is adjusted for minimum reliable detection delay for the lowest AC frequency to be detected.

The continuing average signal illustrated in FIG. 3C is passed to a standard Schmidt trigger circuit 180 that detects the application of the load whenever the voltage of the continuing average voltage signal exceeds a load applied threshold 220. Likewise the Schmidt trigger detects that a load has been removed from the circuit whenever the continuing average signal drops below a load removed threshold 230.

When a load is removed from the AC power source 10, the continuing average wave drops off significantly faster than systems using a capacitive hold AC power detector. The waveform in FIG. 3B, being a square wave, has much less time between peaks than the waveform in FIG. 3A. Therefore the waveform averaging circuit 70 has a much faster response than the peak holding circuit that must filter a waveform similar to the waveform illustrated in FIG. 3A. As a result, the continuous averaging detection provided by the above described system detects the application and/or removal of a load faster than a capacitive hold system. By way of example, the above described system can detect the removal of a load in less than ¼ of a cycle of the AC waveform, whereas a capacitive hold system can take many cycles before it detects the removal of the load.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A fast AC voltage detector comprising:
   a bridge rectifier having inputs for connecting to an AC power source;
   a threshold detector connected to the output of said bridge rectifier, wherein said threshold detector is a Zener driven constant current source;
   an isolation circuit connected to the output of said threshold detector;
   a continuous voltage averager connected to an output of said isolation circuit; and
   a Schmidt trigger amplifier connected to said continuous voltage averager and operable to output a first voltage level when AC voltage is present on said bridge rectifier inputs and a second voltage level when no AC voltage is present on said bridge rectifier inputs.

2. The fast AC voltage detector of claim 1, wherein said bridge rectifier comprises a full wave rectifier operable to rectify an AC waveform into a full wave rectified waveform.

3. The fast AC voltage detector of claim 1, wherein said Zener driven constant current source comprises:
   a Zener diode;
   a transistor, wherein a control input for said transistor is connected to an anode of said Zener diode and wherein an output of said transistor is connected to said isolation circuit such that said transistor is operable to output a constant current when said transistor receives a control current from said Zener diode and is operable to output no current when said transistor does not receive a control current from said Zener diode;
   a plurality of diodes operable to establish a fixed voltage at the control input for said transistor when said Zener diode is conducting current; and
   a fixed resistor operable to set said transistor's output current when said transistor is receives an input from said Zener diode.

4. The fast AC voltage detector of claim 1, wherein said isolation circuit comprises:
   a standard opto-isolator having a light emitting diode optically coupled to a photosensitive transistor.

5. The fast AC voltage detector of claim 1, wherein said continuous voltage average comprises a resistive/capacitive (RC) averaging circuit operable to accept a square wave input and output a continuing average signal representative of the input waveform.

6. The fast AC voltage detector of claim 1, wherein an output of said Schmidt trigger is operable to output a first voltage level when an input of the Schmidt trigger is above an upper input threshold of said Schmidt trigger amplifier and a second voltage level when the input of the Schmidt trigger is below a lower input threshold of said Schmidt trigger amplifier.

7. The fast AC voltage detector of claim 6, wherein said first upper threshold is an AC voltage applied threshold, and said second lower threshold is an AC voltage removed threshold.

8. A method for detecting a load comprising the steps of:
   converting an AC waveform to a square wave representation of said AC waveform;
   converting said square wave representation to a continuous average voltage; and
   detecting a presence of an AC voltage when the continuous average voltage crosses a voltage applied threshold and detecting the removal of said voltage when the continuous average voltage crosses a voltage removed threshold.

9. The method of claim 8, wherein said step of converting an AC waveform to a square wave representation of said AC waveform comprises the steps of:
  full wave rectifying an AC voltage using a bridge rectifier; and
  applying said full wave rectified AC voltage to a threshold detector as a full wave rectified AC load output to produce a square wave.

10. The method of claim 9, wherein said step of applying said full wave rectified AC voltage to a threshold detector to produce a square wave t comprises:
  outputting a high voltage signal to an isolation circuit's input when a voltage of said full wave rectified AC voltage output exceeds a threshold detector's activation voltage; and
  outputting a low voltage signal to said isolation circuit's input when a voltage of said full wave rectified AC voltage output does not exceed said threshold detector's activation voltage.

11. The method of claim 9, wherein said step of outputting a high voltage signal to an isolation circuit's input when a voltage of said full wave rectified AC voltage output exceeds a threshold detector's activation voltage comprises:
  placing a transistor of a Zener driven constant current source in a closed state when a conduction voltage of said Zener driven constant current source is exceeded by said full wave rectified AC load output, thereby outputting a constant current to said isolation circuit, and placing said transistor in an open state when said conduction voltage is not exceeded by said full wave rectified AC load input, thereby outputting no current to said isolation circuit.

12. The method of claim 11, wherein said step of placing a transistor in a closed state when a conduction voltage of said Zener driven constant current source is exceeded by said full wave rectified AC load output comprises providing an output of a Zener diode to said transistor as a transistor control current.

13. The method of claim 8, wherein said step of converting an AC waveform to a continuous average square wave representation of said AC waveform comprises the step of: performing a continuous averaging function on a square wave representation of a full wave rectified AC waveform.

14. The method of claim 8, wherein said step of detecting a presence of said AC voltage whenever the continuous average voltage crosses a AC voltage applied threshold and detecting the removal of AC voltage whenever the continuous average square wave crosses an AC voltage removed threshold comprises the steps of:
  passing a continuous average square wave representation of said AC waveform through a Schmidt trigger;
  outputting a first voltage level from said Schmidt trigger, when the continuous average square wave representation of said AC waveform exceeds the load applied threshold; and
  outputting a second voltage level from said Schmidt trigger when the continuous average square wave representation of said AC waveform is less than the load removed threshold.

15. A fast AC voltage detector comprising:
  a bridge rectifier having inputs for connecting to an AC power source;
  a threshold detector connected to the output of said bridge rectifier;
  an isolation circuit connected to the output of said threshold detector;
  a continuous voltage averager connected to an output of said isolation circuit, wherein said continuous voltage averager comprises a resistive/capacitive (RC) averaging circuit operable to accept a square wave input and output a continuing average signal representative of the input waveform; and
  a Schmidt trigger amplifier connected to said continuous voltage averager and operable to output a first voltage level when AC voltage is present on said bridge rectifier inputs and a second voltage level when no AC voltage is present on said bridge rectifier inputs.

16. The fast AC voltage detector of claim 15, wherein said threshold detector is a Zener driven constant current source.

17. The fast AC voltage detector of claim 16, wherein said Zener driven constant current source comprises:
  a Zener diode;
  a transistor, wherein a control input for said transistor is connected to an anode of said Zener diode and wherein an output of said transistor is connected to said isolation circuit such that said transistor is operable to output a constant current when said transistor receives a control current from said Zener diode and is operable to output no current when said transistor does not receive a control current from said Zener diode;
  a plurality of diodes operable to establish a fixed voltage at the control input for said transistor when said Zener diode is conducting current; and
  a fixed resistor operable to set said transistor's output current when said transistor is receives an input from said Zener diode.

18. The fast AC voltage detector of claim 15, wherein an output of said Schmidt trigger is operable to output a first voltage level when an input of the Schmidt trigger is above an upper input threshold of said Schmidt trigger amplifier and a second voltage level when the input of the Schmidt trigger is below a lower input threshold of said Schmidt trigger amplifier.

19. The fast AC voltage detector of claim 18, wherein said first upper threshold is an AC voltage applied threshold, and said second lower threshold is an AC voltage removed threshold.

20. A fast AC voltage detector comprising:
  a bridge rectifier having inputs for connecting to an AC power source;
  a threshold detector connected to the output of said bridge rectifier;
  an isolation circuit connected to the output of said threshold detector;
  a continuous voltage averager connected to an output of said isolation circuit; and
  a Schmidt trigger amplifier connected to said continuous voltage averager and operable to output a first voltage level when AC voltage is present on said bridge rectifier inputs and a second voltage level when no AC voltage is present on said bridge rectifier inputs;
  wherein an output of said Schmidt trigger is operable to output a first voltage level when an input of the Schmidt trigger is above an upper input threshold of said Schmidt trigger amplifier and a second voltage level when the input of the Schmidt trigger is below a lower input threshold of said Schmidt trigger amplifier; and
  wherein said first upper threshold is an AC voltage applied threshold, and said second lower threshold is an AC voltage removed threshold.

* * * * *

UNITED STATES PATENT AND TRADEMARK OFFICE
CERTIFICATE OF CORRECTION

PATENT NO.        : 8,933,688 B2
APPLICATION NO.   : 13/248583
DATED             : January 13, 2015
INVENTOR(S)       : Eric O. Varland et al.

It is certified that error appears in the above-identified patent and that said Letters Patent is hereby corrected as shown below:

IN THE CLAIMS:

In claim 3, column 4, line 37; after transistor delete "is"

Signed and Sealed this
Twenty-fifth Day of August, 2015

Michelle K. Lee
*Director of the United States Patent and Trademark Office*